(12) United States Patent
Park

(10) Patent No.: US 7,440,343 B2
(45) Date of Patent: Oct. 21, 2008

(54) OUTPUT DRIVING DEVICE

(75) Inventor: Kee-Teok Park, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 179 days.

(21) Appl. No.: 11/477,481

(22) Filed: Jun. 30, 2006

(65) Prior Publication Data

US 2007/0070780 A1    Mar. 29, 2007

(30) Foreign Application Priority Data

Sep. 29, 2005   (KR) ...................... 10-2005-0091669
Dec. 29, 2005   (KR) ...................... 10-2005-0133958

(51) Int. Cl.
*G11C 7/00*    (2006.01)
(52) U.S. Cl. .............. 365/189.11; 365/191; 365/230.06
(58) Field of Classification Search ............ 365/189.11, 365/230.06, 191
See application file for complete search history.

(56) References Cited

U.S. PATENT DOCUMENTS 6,255,867 B1 *   7/2001   Chen ........................... 327/108
6,768,363 B2     7/2004   Yoo et al.
6,870,776 B2 *   3/2005   Kim et al. .............. 365/189.05
7,015,721 B2     3/2006   Nguyen et al.
2003/0189446 A1  10/2003  Yoo et al.

FOREIGN PATENT DOCUMENTS

| JP | 2003-179478 | 6/2003 |
| KR | 10-2001-0004028 | 1/2001 |
| KR | 10-2003-0001964 A | 1/2003 |
| KR | 10-2003-0002200 | 1/2003 |
| KR | 2003-0056849 | 4/2003 |

OTHER PUBLICATIONS

Korean Office Action, issued in Corresponding Korean Patent Application No. KR 10-2005-0133958, dated on Jul. 27, 2007.
Korean Notice of Preliminary Rejection dated Nov. 15, 2006.

* cited by examiner

*Primary Examiner*—Anh Phung
*Assistant Examiner*—Toan Le
(74) *Attorney, Agent, or Firm*—McDermott Will & Emery LLP

(57) ABSTRACT

An output driving device includes a pull-up driver for pull-up driving an output node in response to a pull-up control signal; a pull-down driver for pull-down driving the output node in response to a pull-down control signal; and a first n-type metal oxide semiconductor (NMOS) transistor for pull-up driving the output node in response to a pre-pull-up control signal.

23 Claims, 5 Drawing Sheets

OUTPUT DRIVING DEVICE

FIELD OF THE INVENTION

The present invention relates to an output driving device for use in a semiconductor memory device; and, more particularly, to an output driving device for securing a margin of a valid data period by improving a slew rate.

DESCRIPTION OF RELATED ARTS

Generally, a push-pull type driver is widely used as an output driving device. In connection with a control of the push-pull type output driver, a control of a slew rate has been an issue.

Slew relates how fast the voltage level of an output signal changes. The slew rate is defined as a slope showing a ratio between a voltage level change and a unit time.

Slew rate can be classified into two types: an up slew rate and a down slew rate. The up slew rate indicates a slope for a voltage level of an output signal that changes from a low level to a high level. The down slew rate indicates a slope for a voltage level of an output signal that changes from a high level to a low level. In either case, the greater the slew rate, the steeper the slope of the output signal. That is, the voltage level of the output signal is changed within a short time.

FIG. 1 is a schematic circuit diagram of a conventional output driver for use in a semiconductor memory device.

The conventional output driver includes a pull-up driver PM1 for pull-up driving an output driver in response to a pull-up driving signal PU_CTR; and a pull-down driver NM1 for pull-down driving the output driver in response to a pull-down driving signal PD_CTR.

In detail, the pull-up driver PM1 is a p-type metal oxide semiconductor (PMOS) transistor connected between a driving voltage VDDQ and the output node. A gate of the PMOS transistor receives the pull-up driving signal PU_CTR. The pull-down driver NM1 is an n-type metal oxide semiconductor (NMOS) transistor connected between the output node and a ground voltage VSSQ. A gate of the NMOS transistor receives the pull-down driving signal PD_CTR.

FIG. 2 is a waveform diagram depicting an operation of the conventional output driver.

Referring to FIG. 2, the pull-up driving signal PU_CTR for the pull-up driving operation has a longer activation period than the pull-down driving signal PD_CTR. This is caused by a characteristic of an element included in the conventional output driver. That is, a driving strength and a slew rate of the PMOS transistor PM1 are smaller than those of the NMOS transistor NM1.

Therefore, for securing the same valid data window for logic levels 'H' and 'L' of output data, the PMOS transistor PM1 is designed to have a large size. However, if the size of the PMOS transistor PM1 is increased, the output signal is more vulnerable to noise. Further, since a capacitance of the output node is increased, an input characteristic may be downgraded during inputting/outputting bi-directional data. The above-mentioned problems are more serious during a high speed operation.

SUMMARY OF THE INVENTION

It is, therefore, an object of the present invention to provide an output driver for securing a margin of a valid data period by improving a slew rate.

In accordance with an aspect of the present invention, there is provided an output driving device, including: a pull-up driver for pull-up driving an output node in response to a pull-up control signal; a pull-down driver for pull-down driving the output node in response to a pull-down control signal; and a first n-type metal oxide semiconductor (NMOS) transistor for pull-up driving the output node in response to a pre-pull-up control signal.

In accordance with another aspect of the present invention, there is provided an output driving device, including: a pull-up driver for pull-up driving an output node in response to a pull-up control signal; a pull-down driver for pull-down driving the output node in response to a pull-down control signal; a first NMOS transistor for pull-up driving the output node in response to a pre-pull-up control signal; and a first PMOS transistor for pull-down driving the output node in response to a pre-pull-down control signal 16. In accordance with another aspect of the present invention, there is provided a semiconductor device, including: a first pull-up driving unit for pulling-up an output node to a pull-up voltage in response to a first pull-up control signal; a pull-up level shift circuit for generating a second pull-up control signal in response to a pre pull-up signal wherein a level of the second pull-up control signal is higher than that of the first pull-up control signal; and a second pull-up driving unit for pulling-up the output node to the pull-up voltage in response to the second pull-up control signal.

In accordance with another aspect of the present invention, there is provided a semiconductor device, including: a first pull-down driving unit for pulling-down an output node to a pull-down voltage in response to a first pull-up control signal; a pull-up level shift circuit for generating a second pull-down control signal in response to a pre pull-down signal wherein a level of the second pull-down control signal is higher than that of the first pull-down control signal; and a second pull-down driving unit for pulling-down the output node to the pull-down voltage in response to the second pull-down control signal.

In accordance with another aspect of the present invention, there is provided a semiconductor device, including: a first pull-up driving unit for pulling-up an output node to a pull-up voltage in response to a first pull-up control signal; a pull-up level shift circuit for generating a second pull-up control signal in response to a pre pull-up signal wherein a level of the second pull-up control signal is higher than that of the first pull-up control signal; a second pull-up driving unit for pulling-up the output node to the pull-up voltage in response to the second pull-up control signal; a first pull-down driving unit for pulling-down an output node to a pull-down voltage in response to a first pull-up control signal; a pull-up level shift circuit for generating a second pull-down control signal in response to a pre pull-down signal wherein a level of the second pull-down control signal is higher than that of the first pull-down control signal; and a second pull-down driving unit for pulling-down the output node to the pull-down voltage in response to the second pull-down control signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, an output driving device in accordance with the present invention will be described in detail referring to the accompanying drawings.

Figure 1:
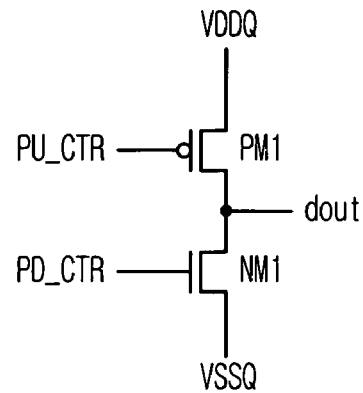
FIG. 1 is a schematic circuit diagram of a conventional output driver for use in a semiconductor memory device.
Figure 2:
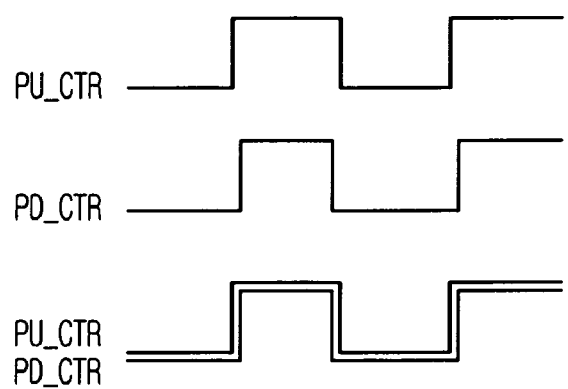
FIG. 2 is a waveform diagram for an operation of the conventional output driver.
Figure 3:
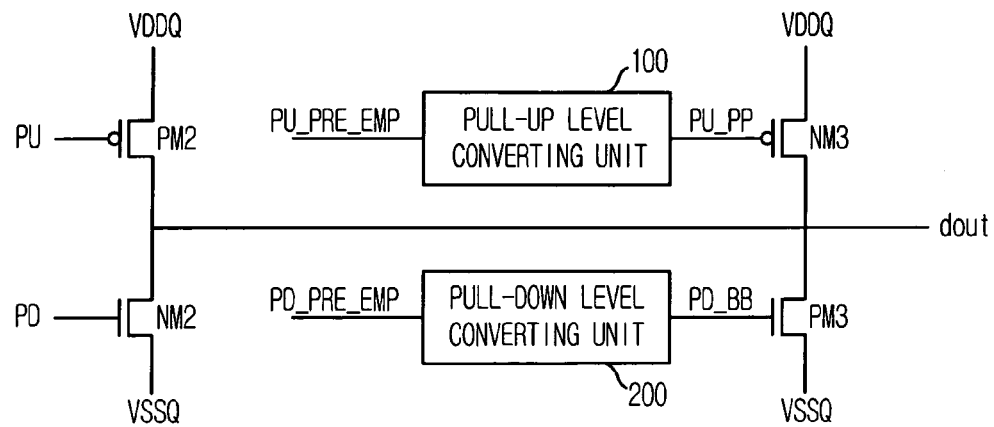
FIG. 3 is a schematic circuit diagram of an output driving device for use in a semiconductor memory device in accordance with the preferred embodiment of the present invention.

FIG. 3 is a schematic circuit diagram of an output driving device for use in a semiconductor memory device in accordance with the preferred embodiment of the present invention.

As shown, the output driving device includes a pull-up driver PM2 for pull-up driving an output node in response to a pull-up control signal PU; a pull-down driver NM2 for pull-down driving the output node in response to a pull-down control signal PD; a pull-up level converting unit 100 for generating a pre-pull-up control signal PU_PP by increasing an activation voltage level of a pre-pull-up emphasis signal PU_PRE_EMP so that the activation voltage level is greater than a driving voltage level; and a first n-type metal oxide semiconductor (NMOS) transistor NM3 for pull-up driving the output node in response to the pre-pull-up control signal PU_PP.

The output driving device further includes a pull-down level converting unit 200 and a first p-type metal oxide semiconductor (PMOS) transistor PM3.

The pull-down level converting unit 200 generates a pre-pull-down control signal PD_BB by decreasing a voltage level of the pre-pull-down control signal PD_BB so that the voltage level of the pre-pull-down control signal PD_BB is lower than a ground voltage VSSQ when a pre-pull-down emphasis signal PD_PRE_EMP is activated. The first PMOS transistor PM3 receives the pre-pull-down control signal PD_BB which is lower than the ground voltage VSSQ in order to pull-down drive the output node.

In detail, the first NMOS transistor NM3 is connected between a driving voltage VDDQ and the output node and receives the pre-pull-up control signal PU_PP through a gate of the first NMOS transistor NM3. The first PMOS transistor PM3 is connected between the output node and the ground voltage VSSQ and receives the pre-pull-down control signal PD_BB through a gate of the first PMOS transistor PM3.

The pull-up driver PM2 is a PMOS transistor connected between the driving voltage VDDQ and the output node and receives the pull-up control signal PU_CTR through a gate of the PMOS transistor PM2. The pull-down driver NM2 is an NMOS transistor connected between the output node and the ground voltage VSSQ and receives the pull-down control signal PD through a gate of the NMOS transistor NM2.

Figure 4:
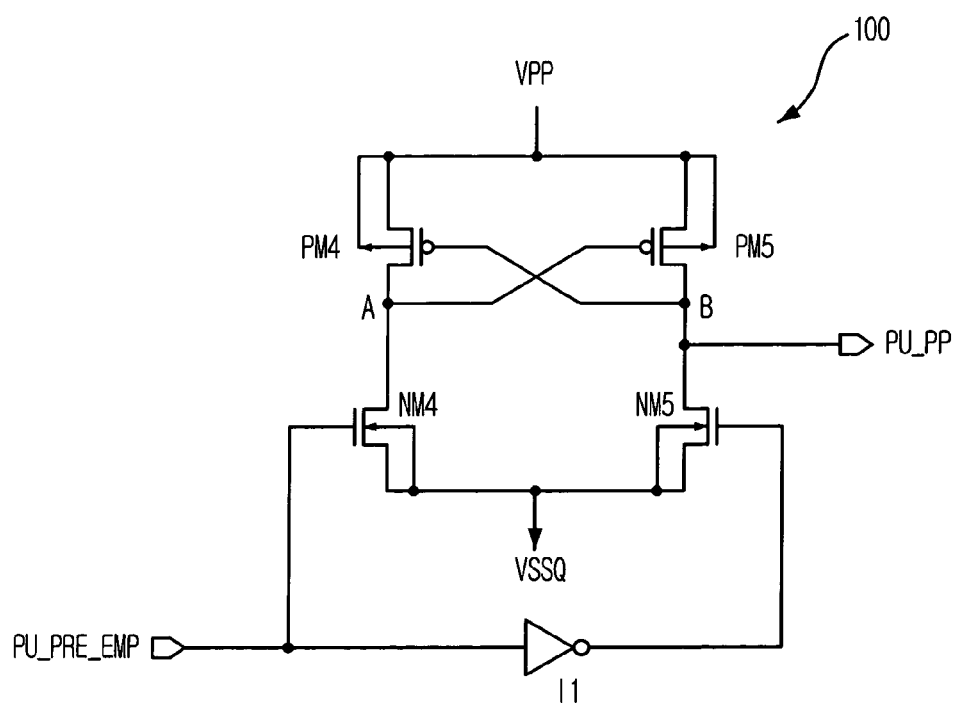
FIG. 4 is a schematic circuit diagram of the pull-up level converting unit shown in FIG. 3.

FIG. 4 is a schematic circuit diagram of the pull-up level converting unit 100 shown in FIG. 3.

As shown, the pull-up level converting unit 100 includes second and third PMOS transistors PM4 and PM5, second and third NMOS transistors NM4 and NM5, and a first inverter I1.

A drain-source path of the second NMOS transistor NM4 is connected between a node A and the ground voltage VSSQ and a gate of the second NMOS transistor NM4 receives the pre-pull-up emphasis signal PU_PRE_EMP. The first inverter I1 serves to invert the pre-pull-up emphasis signal PU_PRE_EMP. A drain-source path of the third NMOS transistor NM5 is connected between a node B and the ground voltage VSSQ and a gate of the third NMOS transistor NM5 receives an output of the first inverter I1.

A drain-source path of the second PMOS transistor PM4 is connected between a high voltage VPP and the node A and a gate of the second PMOS transistor PM4 is coupled to the node B. Similarly, a drain-source path of the third PMOS transistor PM5 is connected between the high voltage VPP and the node B and a gate of the third PMOS transistor PM5 is coupled to the node A. A voltage level of the high voltage VPP is higher than that of the driving voltage VDDQ. A voltage loaded on the node B is output as the pre-pull-up control signal PU_PP the high voltage VPP is higher than the driving voltage VDDQ.

Figure 5:
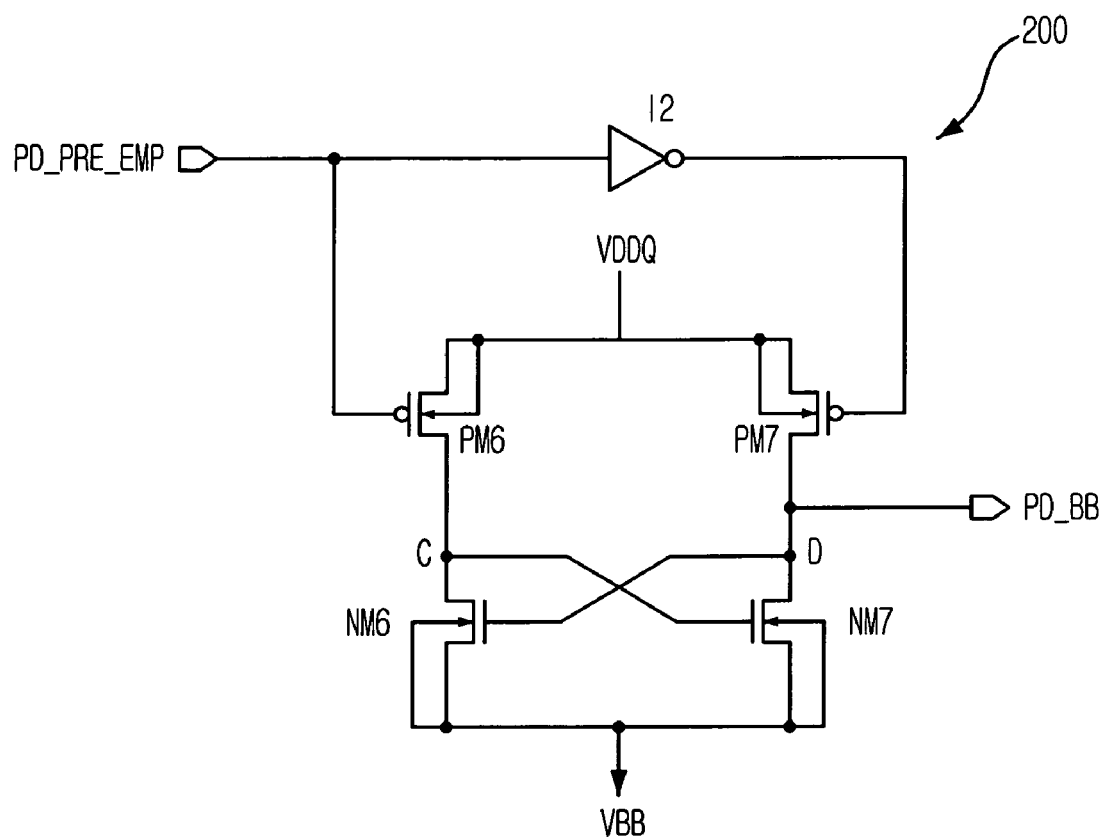
FIG. 5 is a schematic circuit diagram of the pull-down level converting unit shown in FIG. 3.

FIG. 5 is a schematic circuit diagram of the pull-down level converting unit 200 shown in FIG. 3.

As shown, the pull-down level converting unit 200 includes a fourth and a fifth PMOS transistors PM6 and PM7, a fourth and a fifth NMOS transistors NM6 and NM7 and a second inverter I2.

A drain-source path of the fourth PMOS transistor PM6 is connected between the driving voltage VDDQ and a node C and a gate of the fourth PMOS transistor PM6 receives the pre-pull-down emphasis signal PD_PRE_EMP. The second inverter I2 inverts the pre-pull-down emphasis signal PD_PRE_EMP. A drain-source path of the fifth PMOS transistor PM7 is connected between the driving voltage VDDQ and a node D and a gate of the fifth PMOS transistor PM7 receives an output of the second inverter I2.

A drain-source path of the fifth NMOS transistor NM7 is connected between the node D and the bulk voltage VBB and a gate of the fifth NMOS transistor NM7 is coupled to the node C. A drain-source path of the fourth NMOS transistor NM6 is connected between the node C and the bulk voltage VBB and a gate of the fourth NMOS transistor NM6 is coupled to the node D. A voltage loaded on the node D is output as the pre-pull-down control signal PD_BB. The bulk voltage VBB is lower than the ground voltage VSSQ.

Figure 6:
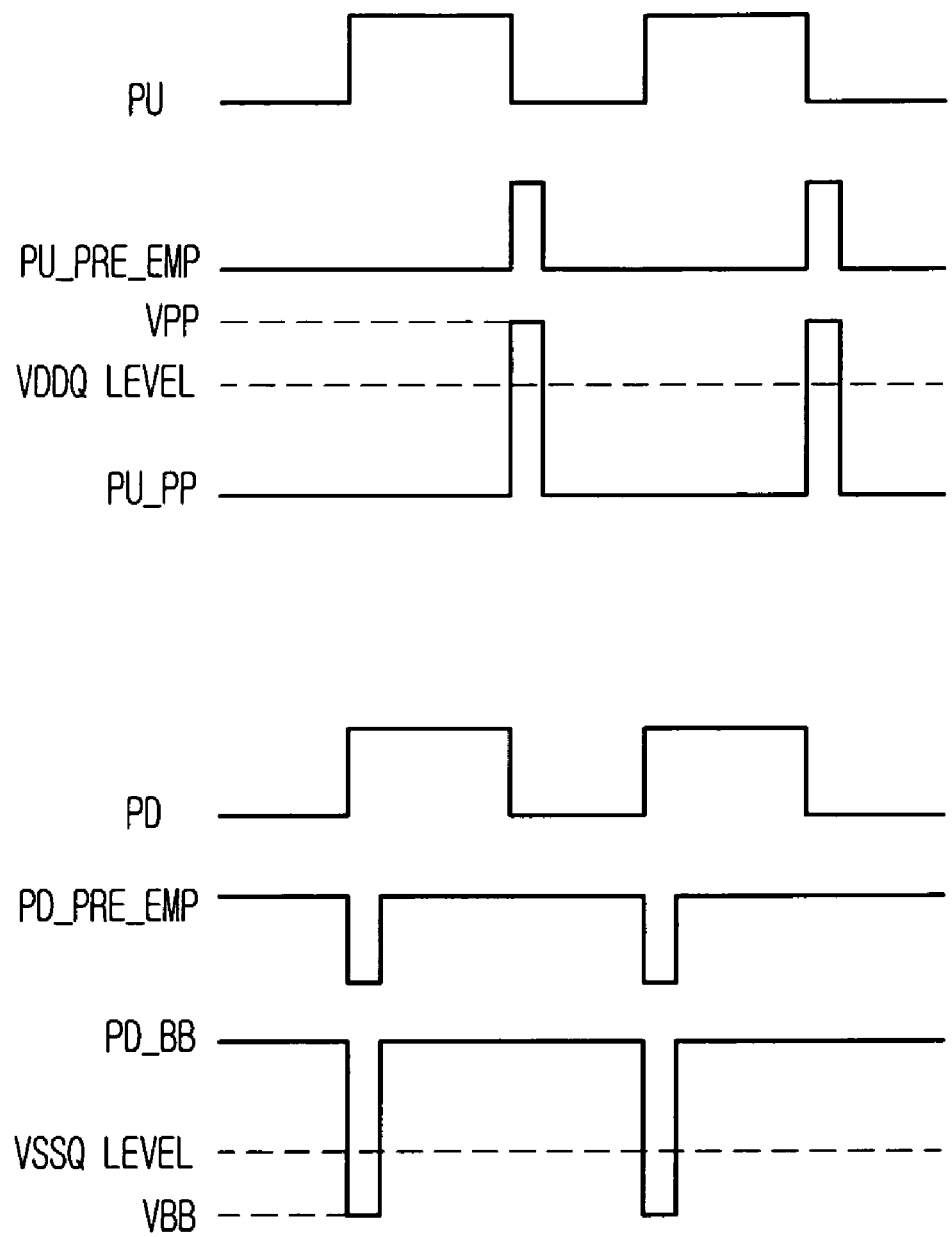
FIG. 6 is a waveform diagram for an operation of the output driving device shown in FIG. 3.

FIG. 6 is a waveform diagram for an operation of the output driving device shown in FIG. 3.

Referring to FIGS. 3 to 6, the operation of the output driving device is described below.

When the pull-up control signal PU is activated as a logic low level, the pull-up driver PM2 is activated and pull-up drives the output node. At this time, since the pre-pull-up emphasis signal PU_PRE_EMP is also activated as a logic high level, the pull-up level converting unit 100 increases a voltage level of the pre-pull-up emphasis signal PU_PRE_EMP so that the voltage level of the pre-pull-up emphasis signal PU_PRE_EMP is greater than the driving voltage VDDQ and, then, outputs the increased signal as the pre-pull-up control signal PU_PP. Therefore, when the pull-up driver PM2 is activated, the first NMOS transistor NM3 is also activated to pull-up drive the output node with the pull-up driver PM2.

Meanwhile, when the pull-down control signal PD is activated as a logic high level, the pull-down driver NM1 is activated and pull-down drives the output node. Since the pre-pull-down emphasis signal PD_PRE_EMP is also activated as a logic low level when the pull-down control signal PD is activated, the pull-down level converting unit 200 decreases a voltage level of the pre-pull-down emphasis signal PD_PRE_EMP so that the voltage of the pre-pull-down emphasis signal PD_PRE_EMP is lower than the ground voltage VSSQ and, then, outputs the decreased signal as the pre-pull-down control signal PD_BB. Therefore, when the pull-down driver NM2 is activated, the first PMOS transistor PM3 is also activated to pull-down drive the output node with the pull-down driver NM2.

Although it is shown that the pre-pull-up emphasis signal PU_PRE_EMP and the pull-up control signal PU are activated at the same time and the pre-pull-down emphasis signal PD_PRE_EMP and the pull-down control signal PD are activated at the same time in FIG. 6, the pre-pull-up emphasis signal PU_PRE_EMP and the pre-pull-down emphasis signal PD_PRE_EMP can be activated earlier than or later than the pull-up control signal PU and the pull-down control signal PD respectively.

Figure 7:
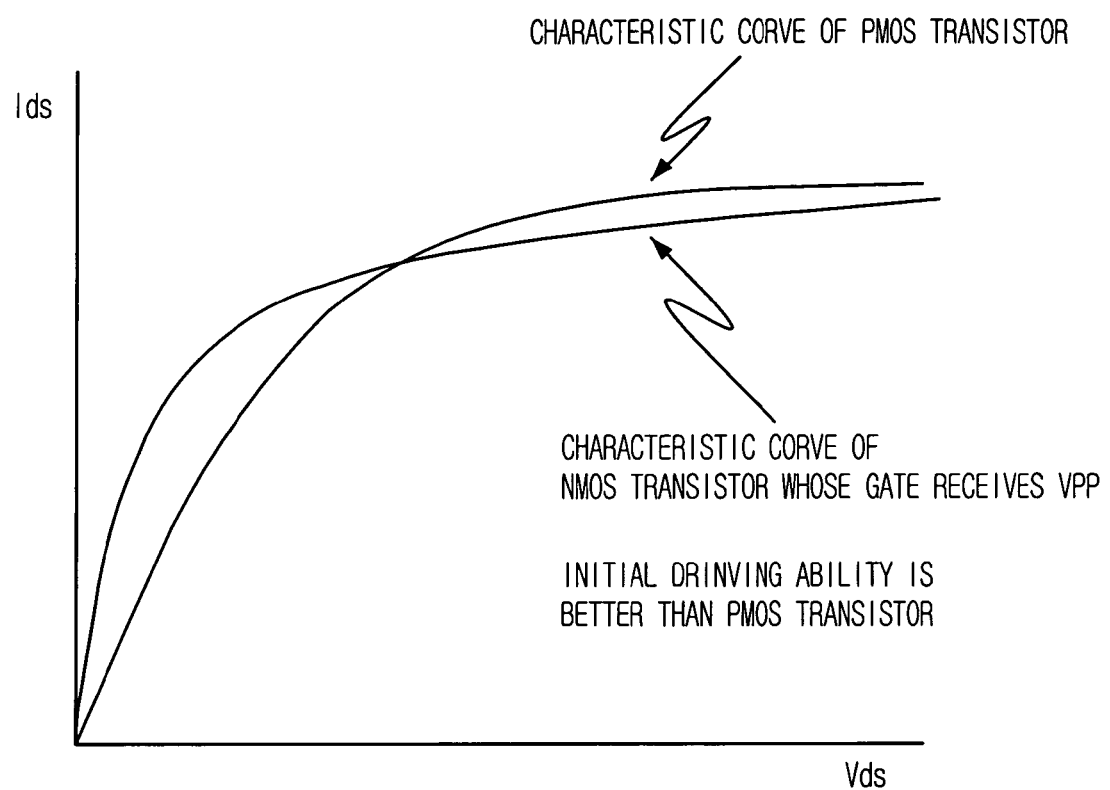
FIG. 7 is a diagram showing a characteristic of a general MOS transistor.

FIG. 7 is a diagram showing a characteristic of a general MOS transistor.

As shown, a slew rate of an NMOS transistor is better than that of a PMOS transistor at an initial operation. Further, it is also shown that the PMOS transistor can transfer a higher voltage level than the NMOS transistor.

In accordance with the preferred embodiment of the present invention, since an NMOS transistor is additionally included for pull-up driving an output node, a slew rate characteristic of a pull-up driver, i.e., a PMOS transistor, can be complemented.

Accordingly, the driving output device in accordance with the preferred embodiment of the present invention can secure enough margin of a valid data period by improving a slew rate.

The present application contains subject matter related to Korean patent application No. 2005-91669 and 2005-133958 filed in the Korea Patent Office on Sep. 29, 2005 and Dec. 29, 2005, respectively, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An output driving device, comprising:
    a pull-up driver for pull-up driving an output node in response to a pull-up control signal;
    a pull-down driver for pull-down driving the output node in response to a pull-down control signal;
    a first n-type metal oxide semiconductor (NMOS) transistor for pull-up driving the output node in response to a pre-pull-up control signal; and
    a pull-up level converting unit for generating the pre-pull-up control signal by increasing an activation voltage level of a pre-pull-up emphasis signal so that the activation voltage level of the pre-pull-up emphasis signal is higher than a driving voltage.

2. The output driving device as recited in claim 1, wherein the pre-pull-up control signal is activated for a predetermined time earlier than, after or during an activation of the pull-up control signal.

3. The output driving device as recited in claim 2, wherein a drain-source path of the first NMOS transistor is connected between the driving voltage and the output node and a gate of the first NMOS transistor receives the pre-pull-up control signal.

4. The output driving device as recited in claim 3, wherein the pull-up driver includes a first p-type metal oxide semiconductor (PMOS) transistor, wherein a drain-source path of the first PMOS transistor is connected between the driving voltage and the output node and a gate of the first PMOS transistor receives the pull-up control signal.

5. The output driving device as recited in claim 4, wherein the pull-down driver includes a second NMOS transistor, wherein a drain-source path of the second NMOS transistor is connected between a ground voltage and the output node and a gate of the second NMOS transistor receives the pull-down control signal.

6. The output driving device as recited in claim 5, wherein the pull-up level converting unit includes:
    a third NMOS transistor whose drain-source path is connected between a first node and the ground voltage and whose gate receives the pre-pull-up emphasis signal;
    an inverter for inverting the pre-pull-up emphasis signal;
    a fourth NMOS transistor whose drain-source path is connected between a second node and the ground voltage and whose gate receives an output of the inverter;
    a second PMOS transistor whose drain-source path is connected between the first node and a high voltage and whose gate is coupled to the second node, wherein the high voltage is higher than the driving voltage; and
    a third PMOS transistor whose drain-source path is connected between the second node and the high voltage and whose gate is coupled to the first node.

7. An output driving device, comprising:
    a pull-up driver for pull-up driving an output node in response to a pull-up control signal;
    a pull-down driver for pull-down driving the output node in response to a pull-down control signal;
    a first NMOS transistor for pull-up driving the output node in response to a pre-pull-up control signal;
    a first PMOS transistor for pull-down driving the output node in response to a pre-pull-down control signal; and
    a pull-up level converting unit for generating the pre-pull-up control signal by increasing an activation voltage level of a pre-pull-up emphasis signal so that the activation voltage level of the pre-pull-up emphasis signal is higher than a driving voltage.

8. The output driving device as recited in claim 7, further comprising:
    a pull-down level converting unit for generating the pre-pull-down control signal by decreasing an activation voltage level of a pre-pull-down emphasis signal so that the activation voltage level of the pre-pull-down emphasis signal is lower than a ground voltage.

9. The output driving device as recited in claim 8, wherein the pre-pull-up control signal is activated for a predetermined time earlier than, after or during an activation of the pull-up control signal and the pre-pull-down control signal is activated for a predetermined time right earlier than, right after or during an activation of the pull-down control signal.

10. The output driving device as recited in claim 9, wherein a drain-source path of the first NMOS transistor is connected between the driving voltage and the output node and a gate of the first NMOS transistor receives the pre-pull-up control signal.

11. The output driving device as recited in claim 10, wherein a drain-source path of the first PMOS transistor is connected between the ground voltage and the output node and a gate of the first PMOS transistor receives the pre-pull-down control signal.

12. The output driving device as recited in claim 11, wherein the pull-up driver includes a second PMOS transistor, wherein a drain-source path of the second PMOS transistor is connected between the driving voltage and the output node and a gate of the second PMOS transistor receives the pull-up control signal and the pull-down driver includes a second NMOS transistor, wherein a drain-source path of the second NMOS transistor is connected between the ground voltage and the output node and a gate of the second NMOS transistor receives the pull-down control signal.

13. The output driving device as recited in claim 12, wherein the pull-up level converting unit includes:
    a third NMOS transistor whose drain-source path is connected between a first node and the ground voltage and whose gate receives the pre-pull-up emphasis signal;
    a first inverter for inverting the pre-pull-up emphasis signal;
    a fourth NMOS transistor whose drain-source path is connected between a second node and the ground voltage and whose age receives an output of the inverter;
    a third PMOS transistor whose drain-source path is connected between the first node and a high voltage and whose gate is coupled to the second node, wherein the high voltage is higher than the driving voltage; and
    a fourth PMOS transistor whose drain-source path is connected between the second node and the high voltage and whose gate is coupled to the first node.

14. The output driving device as recited in claim 13, wherein the pull-down level converting unit includes:
    a fifth PMOS transistor whose drain-source path is connected between a third node and the driving voltage and whose gate receives the pre-pull-down emphasis signal;
    a second inverter for inverting the pre-pull-down emphasis signal;
    a sixth PMOS transistor whose drain-source path is connected between a fourth node and the driving voltage and whose gate receives an output of the second inverter;
    a fifth NMOS transistor whose drain-source path is connected between the fourth node and the ground voltage and whose gate is coupled to the third node; and
    a sixth NMOS transistor whose drain-source path is connected between the fourth node and the ground voltage and whose gate is coupled to the fourth node.

15. A semiconductor device, comprising:
    a first pull-up driving unit for pulling-up an output node to a pull-up voltage in response to a first pull-up control signal;
    a pull-up level shift circuit for generating a second pull-up control signal in response to a pre pull-up signal wherein a level of the second pull-up control signal is higher than that of the first pull-up control signal; and
    a second pull-up driving unit for pulling-up the output node to the pull-up voltage in response to the second pull-up control signal.

16. The semiconductor device of the claim 15, wherein the pre pull-up signal is activated at a predetermined timing corresponding to an activating timing of the first pull-up control signal.

17. A semiconductor device, comprising:
    a first pull-down driving unit for pulling-down an output node to a pull-down voltage in response to a first pull-up control signal;
    a pull-up level shift circuit for generating a second pull-down control signal in response to a pre pull-down signal wherein a level of the second pull-down control signal is higher than that of the first pull-down control signal; and
    a second pull-down driving unit for pulling-down the output node to the pull-down voltage in response to the second pull-down control signal.

18. The semiconductor device of the claim 17, wherein the pre pull-down signal is activated at a predetermined timing corresponding to an activating timing of the first pull-down control signal.

19. A semiconductor device, comprising:
    a first pull-up driving unit for pulling-up an output node to a pull-up voltage in response to a first pull-up control signal;
    a pull-up level shift circuit for generating a second pull-up control signal in response to a pre pull-up signal wherein a level of the second pull-up control signal is higher than that of the first pull-up control signal;
    a second pull-up driving unit for pulling-up the output node to the pull-up voltage in response to the second pull-up control signal;
    a first pull-down driving unit for pulling-down an output node to a pull-down voltage in response to a first pull-up control signal;
    a pull-up level shift circuit for generating a second pull-down control signal in response to a pre pull-down signal wherein a level of the second pull-down control signal is higher than that of the first pull-down control signal; and
    a second pull-down driving unit for pulling-down the output node to the pull-down voltage in response to the second pull-down control signal.

20. The semiconductor device of the claim 19, wherein the pre pull-up signal is activated at a predetermined timing corresponding to an activating timing of the first pull-up control signal.

21. The semiconductor device of the claim 20, wherein the pre pull-down signal is activated at a predetermined timing corresponding to an activating timing of the first pull-down control signal.

22. A semiconductor device, comprising:
    a pull-up driver for pull-up driving an output node in response to a pull-up control signal;
    a pull-down driver for pull-down driving the output node in response to a pull-down control signal; and
    a driving unit for driving the output node with a determined level in response to a control signal,
    wherein the control signal is activated regardless of activating of the pull-up control signal and the pull-down control signal.

23. The semiconductor device of the claim 22, further comprising a level converting unit for converting a pre-pull-up control signal and a pre-pull-down control signal to the pull-up control signal and the pull-down control signal respectively wherein a level of the pre-pull-up control signal and the pre-pull-down control signal is lower than that of the pull-up control signal and the pull-down control signal, respectively.

* * * * *